United States Patent
Wang et al.

(10) Patent No.: US 7,615,866 B2
(45) Date of Patent: Nov. 10, 2009

(54) CONTACT SURROUNDED BY PASSIVATION AND POLYMIDE AND METHOD THEREFOR

(75) Inventors: James Jen-Ho Wang, Phoenix, AZ (US); Paul T. Hui, Mesa, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 100 days.

(21) Appl. No.: 11/419,798

(22) Filed: May 23, 2006

(65) Prior Publication Data

US 2007/0275549 A1 Nov. 29, 2007

(51) Int. Cl.
*H01L 23/48* (2006.01)
*H01L 23/52* (2006.01)

(52) U.S. Cl. .................. 257/751; 257/737; 257/779; 257/784; 257/E23.021

(58) Field of Classification Search ............. 257/751, 257/737, 779, 784, E23.021
See application file for complete search history.

(56) References Cited

U.S. PATENT DOCUMENTS

| | | | |
|---|---|---|---|
| 5,317,081 A * | 5/1994 | Gelorme et al. ............. | 528/353 |
| 6,077,765 A | 6/2000 | Naya | |
| 2004/0151893 A1 * | 8/2004 | Kydd et al. ................. | 428/323 |
| 2005/0136558 A1 | 6/2005 | Wang et al. | |
| 2005/0200014 A1 | 9/2005 | Chen et al. | |
| 2005/0224966 A1 | 10/2005 | Fogel et al. | |
| 2006/0022311 A1 | 2/2006 | Lin | |
| 2006/0049525 A1 | 3/2006 | Lin et al. | |
| 2006/0060961 A1 | 3/2006 | Lin et al. | |
| 2006/0079025 A1 * | 4/2006 | Kripesh et al. ............. | 438/113 |
| 2006/0214296 A1 * | 9/2006 | Okamoto et al. ............ | 257/751 |
| 2007/0134903 A1 * | 6/2007 | Ryan .......................... | 438/612 |

OTHER PUBLICATIONS

Wang et al; "Power Gold for 175° C Tj-max"; 2003 Proceedings of Pan Pacific Microelectronics Symposium; Feb. 18-20, 2003.

* cited by examiner

*Primary Examiner*—Asok K Sarkar
(74) *Attorney, Agent, or Firm*—James L. Clingan, Jr.

(57) ABSTRACT

A semiconductor device has contact between the last interconnect layer and the bond pad that includes a barrier metal between the bond pad and the last interconnect layer. Both a passivation layer and a polyimide layer separate the last interconnect layer and the bond pad. The passivation layer is patterned to form a first opening to contact the last interconnect layer. The polyimide layer is also patterned to leave a second opening that is inside and thus smaller than the first opening through the passivation. The barrier layer is then deposited in contact with the last interconnect layer and bounded by the polyimide layer. The bond pad is then formed in contact with the barrier, and a wire bond is then made to the bond pad.

5 Claims, 2 Drawing Sheets

CONTACT SURROUNDED BY PASSIVATION AND POLYMIDE AND METHOD THEREFOR

FIELD OF THE INVENTION

This invention relates to integrated circuits, and more particularly, to contacts that are surrounded by a passivation layer and a polyimide layer.

BACKGROUND OF THE INVENTION

Contacts for bond pads for high power integrated circuits commonly have an aluminum interface. Aluminum is used as the last layer of interconnect as well as bond pad metal with gold wire bonded to the aluminum bond pads. For better durability at higher temperature, gold may be used for the bond pad. A gold bond pad is similar to the gold bumps used for tape automated bonding (TAB) that do not require any wire bonds. At higher temperatures, however, such as continuous junction operating temperatures above 125 degrees Celsius, there have been life span limitations with this approach. For applications such as engine control, it is desirable to withstand the higher temperatures for longer life span. At the higher temperatures the gold will eventually diffuse into the aluminum, which causes the area of the aluminum that has the diffused gold to become brittle and weak. When this happens, the diffused region is likely to crack and cause a failure. A number of barrier metals such as titanium tungsten (TiW), titanium tungsten nitride (TiWN), chromium, and platinum have been proposed. All, although generally effective, still have limited barrier lifespan at the higher temperatures.

Thus, there is a need for a contact between an interconnect layer and the overlying bond pad metal that improves durability without adversely impacting cost or unduly adding to process complexity.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has contact between the last interconnect layer and the bond pad metal that includes a barrier metal between the bond pad and the last interconnect layer. Both a passivation layer and a polyimide layer separate the last interconnect layer and the bond pad. The passivation layer is patterned to form a first contact opening to contact the last interconnect layer. The polyimide layer is also patterned to leave a second opening that is inside and thus smaller than the first contact opening through the passivation. The barrier layer is then deposited in contact with the last interconnect layer and bounded by the polyimide layer. The bond pad metal is then formed in contact with the barrier, and a wire bond is then made to the bond pad metal. This is better understood by reference to the drawings and the following description.

Figure 1:
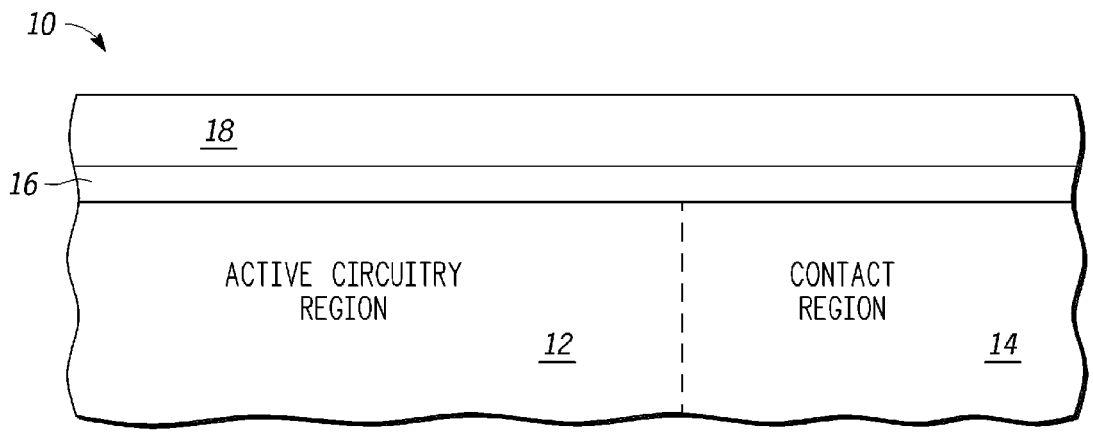
FIG. 1 is a cross section of a semiconductor device at a stage in a process that is according to an embodiment of the invention.

Shown in FIG. 1 is a semiconductor device structure 10 having an active circuitry region 12, a contact region 14, an aluminum layer 16 over active circuitry 12 and contact region 14, and a passivation layer 18 over aluminum layer 16. In this example semiconductor device structure 10, shown in simplified form, is a completed integrated circuit that needs to have bond pads placed on it. Aluminum layer 16 is the last interconnect layer of the integrated circuit and although aluminum is generally preferable, could be another material. Although aluminum layer 16 as shown in FIG. 1 is continuous, aluminum layer 16 is patterned in areas not shown to achieve its function as an interconnect layer. Aluminum layer 16 in this example is preferably about 0.6 microns but could be another thickness.

Active circuitry region 12 is the portion of the integrated circuit where transistors and other circuit elements are formed and includes the interconnect for those transistors and other circuit elements. This is typically achieved with a silicon substrate for use in forming certain portions of the transistors, one or more polysilicon layers for use as transistor elements and interconnect, and interconnect metal layers above the polysilicon layer or layers for providing the necessary interconnections and power connections. The last interconnect layer, aluminum layer 16 in this example, is the highest in the stack of interconnect layers. Other functions may also be present. Electrostatic discharge (ESD) protection circuitry, may be placed in the contact region. Contact regions that are not directly under a ball bond pad may also have active circuitry present. Passivation layer 18 is preferably plasma oxide/nitride about 1.0 microns thick but could be different thickness and could be of another suitable dielectric material. Thus, the contact region is the region where the contact to the last metal layer is made for the bond pad.

Figure 2:
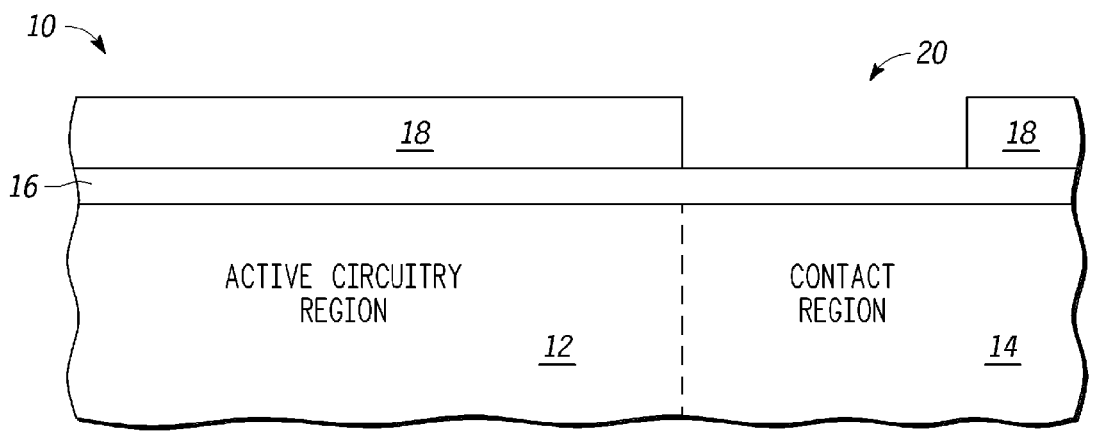
FIG. 2 is a cross section of the semiconductor device at a stage in the process subsequent to that shown in FIG. 1.

Shown in FIG. 2 is semiconductor device structure 10 after a patterned etch of passivation layer 18 to leave a opening 20 in passivation layer 18 over contact region 14. Opening 20 is preferably about 15 by 21 microns but could be of other dimensions.

Figure 3:
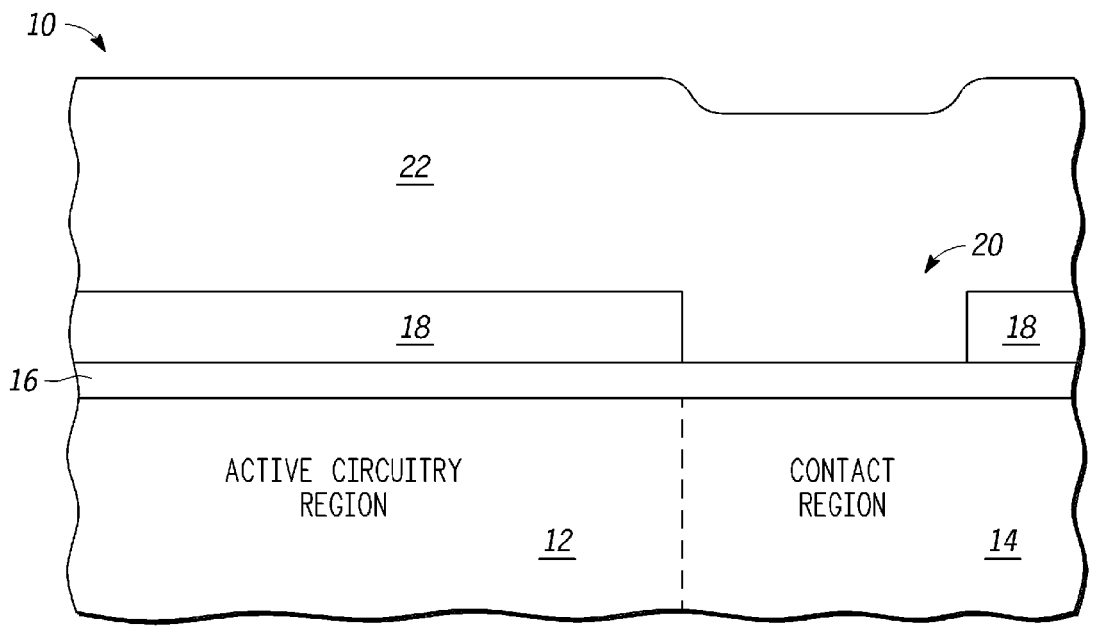
FIG. 3 is a cross section of the semiconductor device at a stage in the process subsequent to that shown in FIG. 2.

Shown in FIG. 3 is semiconductor device structure 10 after deposition by spin coating of polyimide layer 22 that is about 8 microns thick before curing.

Figure 4:
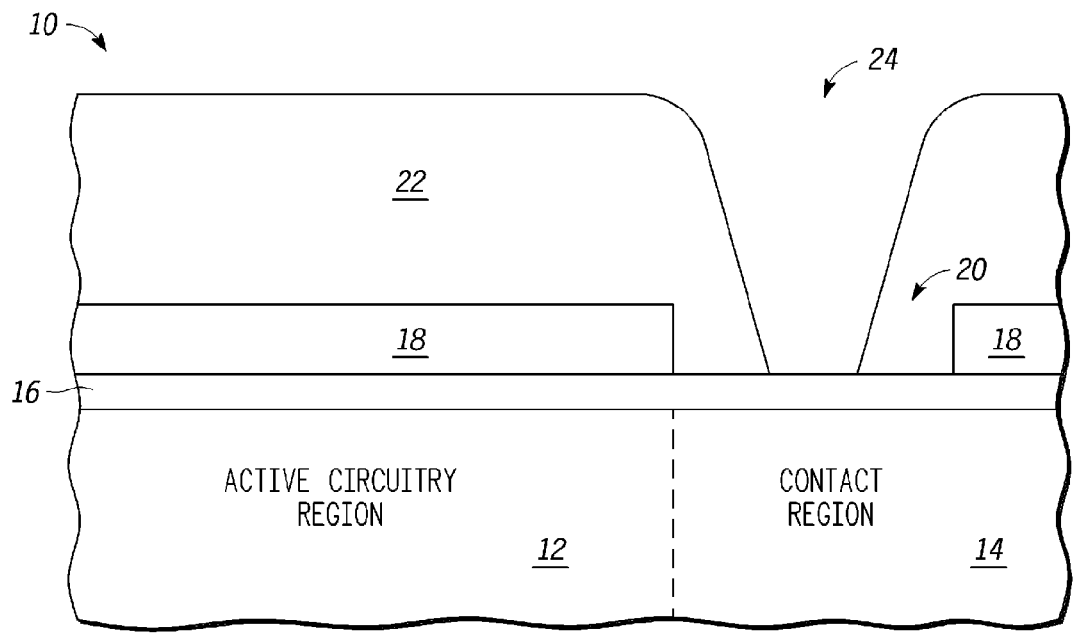
FIG. 4 is a cross section of the semiconductor device at a stage in the process subsequent to that shown in FIG. 3.

Shown in FIG. 4 is semiconductor device structure 10 after patterning polyimide layer 22 to form an opening 24 within opening 20. Opening 24 is preferably about 12 by 18 microns at aluminum layer 16. Opening 24 has substantial slope that may be 45 degrees. On the other hand it can be only 10 degrees from vertical. Opening 24 is separated from opening 20 by about 2 microns of polyimide per side.

Figure 5:
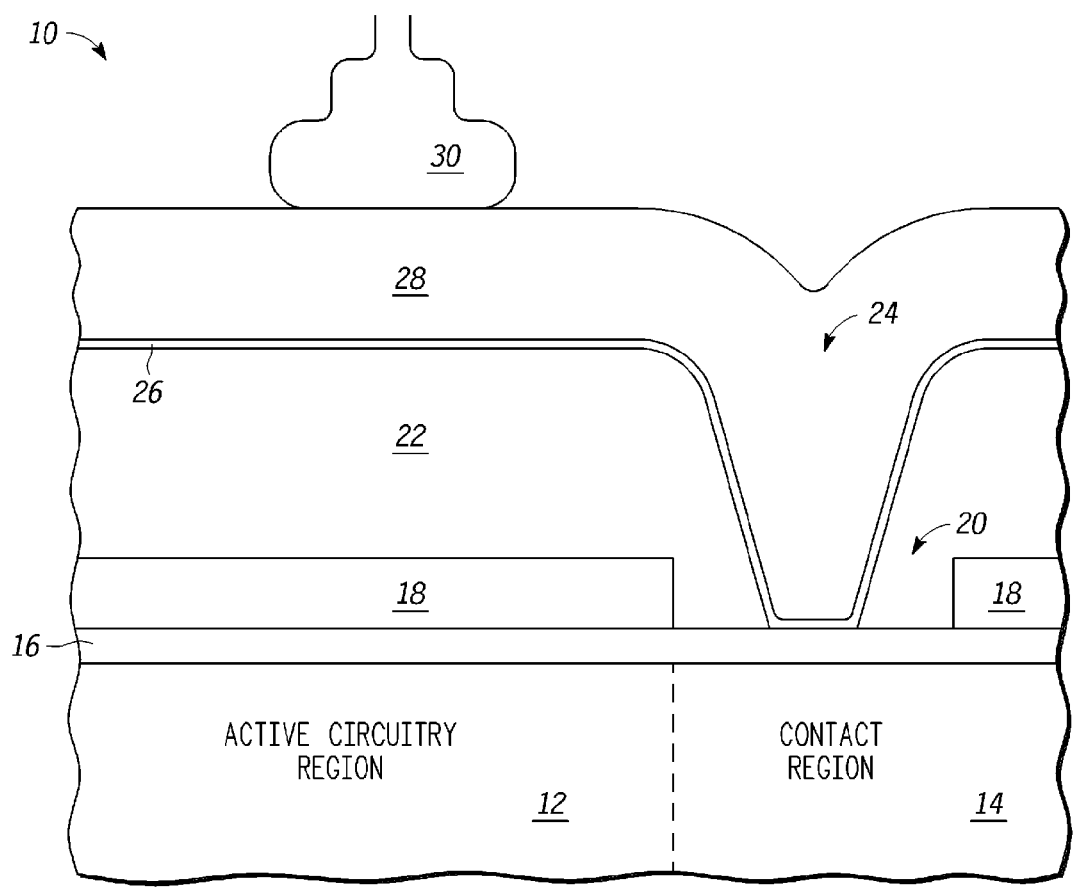
FIG. 5 is a cross section of the semiconductor device at a stage in the process subsequent to that shown in FIG. 4.

Shown in FIG. 5 is semiconductor device structure 10, after deposition of a titanium tungsten (TiW) layer 26 on polyimide layer 22 and on aluminum layer 16 in opening 24, a gold layer 28 on TiW layer 26, and a wire bond on gold layer 28. TiW layer 26 is preferably about 0.35 microns thick. Gold layer 28 is preferably about 9 microns thick but may be another thickness. Gold layer 28 is conventionally made by first sputtering a thin layer of gold seed metal to obtain a gold/TiW seed layer and, after patterning a thick photoresist over the gold/TiW seed layer, then electroplating 9 microns of gold only where there is no photoresist cover of the gold/TiW seed layer. The photoresist and the portion of the thin gold/TiW seed metal that is not under the electroplated thick gold layer are also chemically stripped; leaving patterned and separated gold bond pads having contact to the desired points in the aluminum interconnect layer. Gold layer 28 is substantially conformal so substantially follows the contour of polyimide layer 22. The bond pad formed of gold layer 28 is over a flat portion of gold layer 28 and polyimide layer 22 and may be over active circuitry region 12 as shown in FIG. 4. Gold layer 28 and TiW layer 26 in opening 24 are thus separated from the sidewall of passivation layer 18 by at least one micron of polyimide.

The polyimide providing separation between the sidewall of passivation layer 18 and gold layer 28 has proven to make a significant difference in durability of the contact between aluminum layer 16 and gold layer 28 for high temperature applications. The inventors discovered that when the TiW barrier was along the sidewall of the passivation layer, gold diffused through the TiW barrier and into the aluminum at this location at high temperature at far too great of a rate. The root cause of this high rate of diffusion at this location is not known. One theory is that when the polyimide is etched to expose the aluminum, there is some undercutting of the aluminum that extends under the passivation causing more difficult step coverage of the passivation by the barrier metal. Another theory is that the TiW layer is not a very good barrier at the stress point of the corner of the sidewall where 3 different rigid materials trisect. The approach of the invention's use of polyimide may provide some form of mechanical stress relief over the passivation. In any event, the problem of a poor barrier metal at the sidewall of the passivation layer is greatly improved by separating the passivation sidewall from the TiW with polyimide. The result of the approach of the invention is significantly improved durability of the contact.

The polyimide used should be able to be patterned to the dimensions described and perhaps even smaller. A photo-imageable polyimide may be used for this purpose. Another benefit of photo-imageable polyimide is that a step of depositing photoresist for patterning the polyimide is not required. In effect the photo-imageable polyimide is similar to photoresist with the advantage over photoresist that it can be left remaining after patterning for the normal uses of polyimide. Additionally, the polyimide should have a low polyamic acid content, preferably be substantially free of polyamic acid. The polymerization of some polyimides results in residual acid that then acts as a corrosive agent under high humidity ambients. One such polyimide that has been found effective is sold under the trade designation PI2771 by Hitachi-Dupont.

Various other changes and modifications to the embodiments herein chosen for purposes of illustration will readily occur to those skilled in the art. For example, other thicknesses than those disclosed may be effective. Also, there is believed to be a particular benefit to the materials used but other materials may also be effective. The application described was for wire bonding but other applications such as TAB bonding may also be applicable. To the extent that such modifications and variations do not depart from the spirit of the invention, they are intended to be included within the scope thereof which is assessed only by a fair interpretation of the following claims.

The invention claimed is:

1. A semiconductor device, comprising:
   an active circuitry region;
   a contact region exclusive of the active circuitry region;
   a last interconnect layer comprising aluminum over the active circuitry and the contact region;
   a passivation layer over the last interconnect layer having a first opening bounded by a sidewall of the passivation layer and over the contact region;
   a polyimide layer over the passivation layer having a second opening that is within the first opening so that the polyimide layer separates the second opening from the sidewall of the passivation layer;
   a barrier metal layer comprising titanium tungsten over the polyimide layer and contacting the last interconnect layer in the second opening;
   a bond pad metal comprising gold over the barrier metal having a contact portion outside the contact region and over the active circuitry region; and
   a wire bond on the contact portion; wherein:
   the barrier metal layer, the bond pad metal, and the last interconnect layer form an electrical contact; and
   the polyimide layer improves durability of the contact by separating the second opening from the sidewall of the passivation layer.

2. The semiconductor device of claim 1, wherein the polyimide layer comprises photo-imageable polyimide.

3. The semiconductor device of claim 2, wherein polyimide layer is substantially free of polyamic acid.

4. The semiconductor device of claim 3, wherein the passivation layer comprises nitride.

5. The semiconductor device of claim 4, wherein the sidewall of the passivation layer is separated from the bond metal by at least one micron of polyimide.

\* \* \* \* \*